United States Patent
Lee

(10) Patent No.: US 8,570,071 B2
(45) Date of Patent: Oct. 29, 2013

(54) PHASE ADJUSTMENT APPARATUS AND CLOCK GENERATOR THEREOF AND METHOD FOR PHASE ADJUSTMENT

(75) Inventor: Jiunn-Yih Lee, Hsinchu (TW)

(73) Assignee: MStar Semiconductor, Inc., Hsinchu (TW)

( * ) Notice: Subject to any disclaimer, the term of this patent is extended or adjusted under 35 U.S.C. 154(b) by 0 days.

(21) Appl. No.: 13/343,056

(22) Filed: Jan. 4, 2012

(65) Prior Publication Data

US 2013/0043909 A1 Feb. 21, 2013

(30) Foreign Application Priority Data

Aug. 16, 2011 (TW) .............................. 100129248 A

(51) Int. Cl.
*G01R 25/00* (2006.01)
(52) U.S. Cl.
USPC ................................ 327/3; 327/234; 327/243
(58) Field of Classification Search
USPC .............. 327/2, 3, 5, 12, 105, 107, 231–237, 327/243–245, 250, 251, 258
See application file for complete search history.

(56) References Cited

U.S. PATENT DOCUMENTS

| | | | | |
|---|---|---|---|---|
| 5,087,829 A * | 2/1992 | Ishibashi et al. | ............... | 327/152 |
| 6,041,089 A * | 3/2000 | Yokomizo | ..................... | 375/371 |
| 6,754,147 B2 * | 6/2004 | Hsu et al. | .................. | 369/47.28 |
| 7,446,616 B2 * | 11/2008 | Lee | ................................ | 331/45 |
| 7,463,710 B2 * | 12/2008 | Walsh et al. | .................. | 375/376 |
| 7,688,928 B2 * | 3/2010 | Lin et al. | ........................ | 375/376 |
| 7,932,763 B2 * | 4/2011 | Chen et al. | ..................... | 327/236 |
| 7,948,260 B1 * | 5/2011 | Shilshtut | .......................... | 326/9 |
| 8,072,253 B2 * | 12/2011 | Kaeriyama et al. | ........... | 327/231 |
| 8,238,504 B2 * | 8/2012 | Tomita et al. | ................. | 375/371 |
| 2002/0003373 A1 | 1/2002 | Hale, Jr. et al. | | |
| 2002/0033738 A1 * | 3/2002 | Saeki et al. | ..................... | 331/17 |
| 2005/0243163 A1 * | 11/2005 | Ozasa et al. | .................. | 347/243 |
| 2006/0014573 A1 | 1/2006 | Wuidart et al. | | |
| 2006/0020881 A1 | 1/2006 | Szabo et al. | | |
| 2010/0020257 A1 | 1/2010 | Jun et al. | | |
| 2012/0064844 A1 * | 3/2012 | Miyashita et al. | .............. | 455/84 |
| 2013/0043918 A1 * | 2/2013 | Ma | ................................ | 327/158 |

* cited by examiner

*Primary Examiner* — William Hernandez
(74) *Attorney, Agent, or Firm* — WPAT, PC; Justin King

(57) ABSTRACT

A phase adjustment apparatus for providing a clock signal to a core circuit is provided. The core circuit is powered by a core voltage. The phase adjustment apparatus includes two clock receiving ends, a plurality of digital receiving ends and a combination circuit. The two clock receiving ends receive two original clocks having a same frequency while the two original clock signals possess different phases. The digital receiving ends receive a plurality of phase selection signals. The synthesizing circuit is powered by a first voltage lower than the core voltage, and generates the clock signal according to the phase control signals and the two original clock signals.

9 Claims, 6 Drawing Sheets

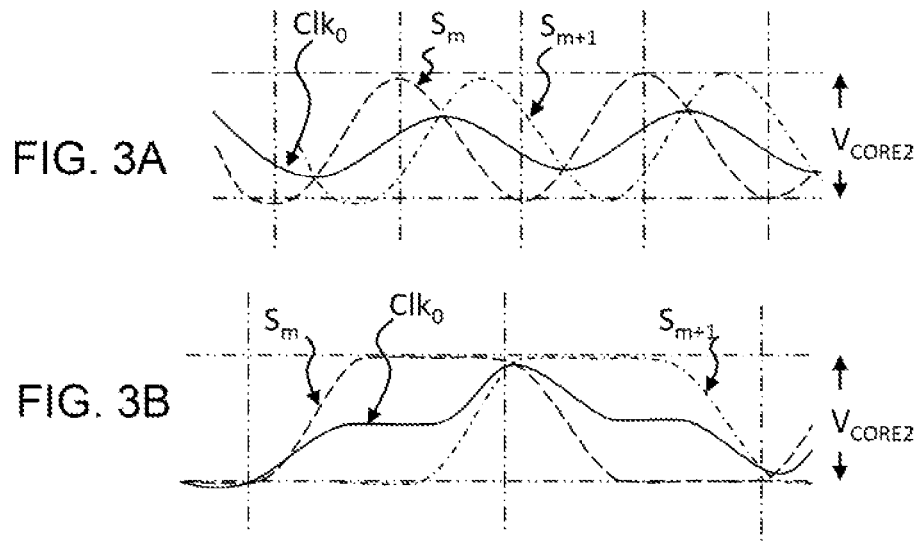
FIG. 3A
FIG. 3B
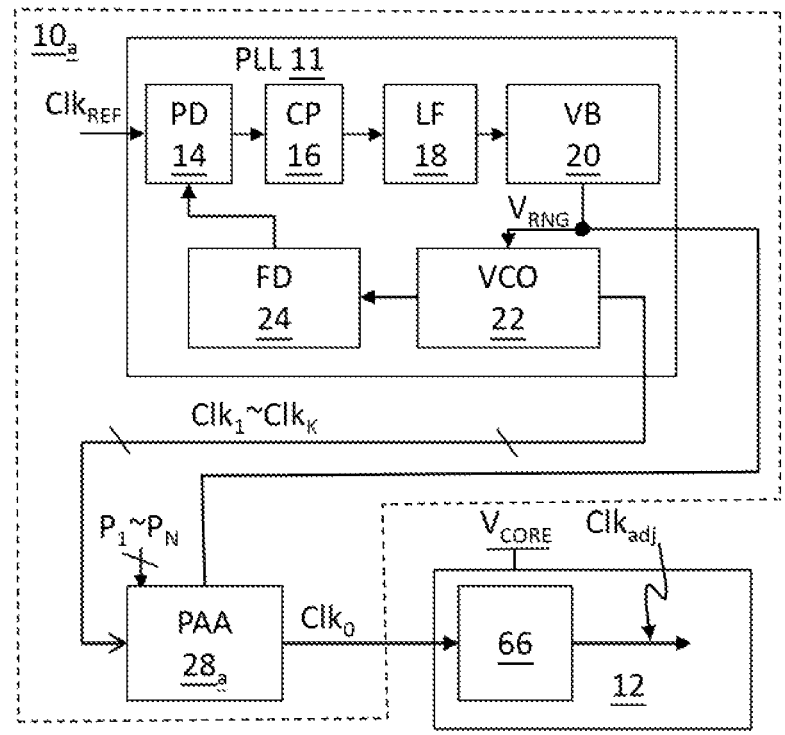
FIG. 4

PHASE ADJUSTMENT APPARATUS AND CLOCK GENERATOR THEREOF AND METHOD FOR PHASE ADJUSTMENT

FIELD OF THE INVENTION

The present invention relates to a phase adjustment apparatus, a clock generator and a method for adjusting a phase of a clock.

BACKGROUND OF THE INVENTION

Current televisions or communication products retrieve transmission signals from carriers. Therefore, a receiving end needs to generate an extremely precise local oscillation signal or a clock signal for demodulating the carriers. In addition, for the clock signal, precision is required not only in frequency, but also in phase.

Conventionally, a phase-locked loop (PLL) is capable of generating an original clock signal having a same frequency as that of a reference signal. However, a phase of the original signal may differ from a desired phase. To obtain a clock signal with precision in both phase and frequency, an adjustment on the phase of the original clock signal may be required.

SUMMARY OF THE INVENTION

A phase adjustment apparatus for providing a clock signal to a core circuit is disclosed according to an embodiment of the present invention. The core circuit is powered by a core voltage. The phase adjustment apparatus comprises two clock receiving ends, a plurality of digital receiving ends and a combination circuit. The two clock receiving ends receive two original clocks having a same frequency while the two original clock signals possess two different phases. The digital receiving ends receive a plurality of phase selection signals. The synthesizing circuit, powered by a first voltage lower than the core voltage, generates the clock signal according to the phase selection signals and the two original clock signals.

A clock generator comprising a phase-locked loop and a phase adjustment apparatus is disclosed according to an embodiment of the present invention. The phase-locked loop comprises a voltage-controlled oscillator (VCO) and a loop filter. The VCO generates two original clock signals having a same frequency and different phases according to a control voltage. The loop filter generates the control voltage for controlling frequencies of the two original clock signals. The phase adjustment apparatus, powered by a first voltage, generates a clock signal according to a ratio and the two original clock signals. The clock signal is provided to a core circuit, which is powered by a core voltage. The first voltage is smaller than the core voltage.

A phase adjustment method for providing a clock signal to a core circuit is further disclosed by the present invention. The core circuit is powered by a core voltage. The method comprises: generating a clock signal by synthesizing two original clock signals and according to a ratio. The two original clock signals have a same frequency while the two original clock signals possess different phases. An amplitude of the clock signal is smaller than that of the core voltage.

BRIEF DESCRIPTION OF THE DRAWINGS

The above objects and advantages of the present invention will become more readily apparent to those ordinarily skilled in the art after reviewing the following detailed description and accompanying drawings, in which:

FIGS. 3A and 3B respectively show relationships between the clock signal $Clk_0$ and signals $S_m$ and $S_{m+1}$ under two different frequencies;
FIG. 4 shows another operating system.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
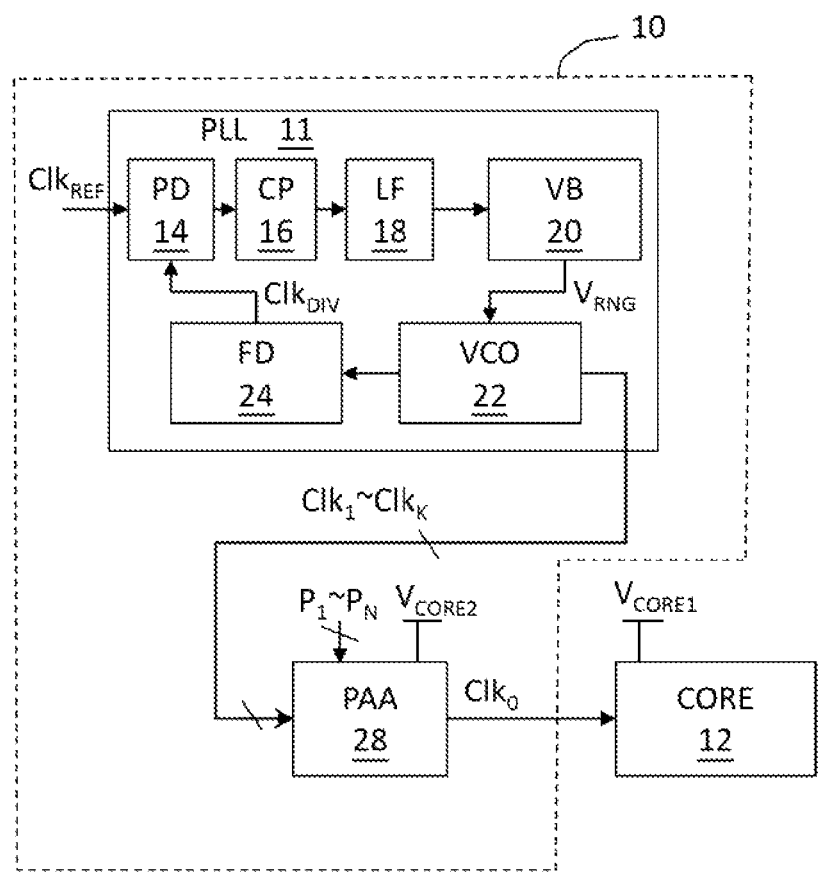
FIG. 1 is an operating system.

FIG. 1 shows an operating system comprising a clock generator 10 and a core circuit 12. The clock generator 10 comprises a phase adjustment apparatus 28 and a phase-locked loop 11. The phase-locked loop 11 comprises a phase detector 14 for receiving a reference signal $Clk_{REF}$, a charge pump 16, a loop filter 18, a voltage buffer 20, a voltage-controlled oscillator (VCO) 22 and a frequency divider 24.

The phase detector 14 generates a phase difference between the reference signal $Clk_{REF}$ and a frequency divided clock $Clk_{DIV}$ to drive the charge pump 16. A current sent or drawn by the charge pump 16 forms a control voltage $V_{CTL}$ after passing through the loop filter 18.

As shown in FIG. 1, after passing through the voltage buffer 20, the control voltage $V_{CTL}$ becomes an adjusting control voltage $V_{RNG}$. Alternatively, the control voltage $V_{CTL}$ may directly serve as the adjustment control voltage $V_{RNG}$ for controlling frequencies of a plurality of original clocks $Cl_1$ to $Cl_K$ generated by the VCO 22. The original clocks $Cl_1$ to $Cl_K$ are common in frequency, but different in phase. One of the original clock signals $Cl_1$ to $Cl_K$ is frequency divided by the frequency divider 24 to generate the frequency divided clock $Clk_{DIV}$ fed back to the phase detector 14.

The phase adjustment apparatus 28 receives the original clock signals $Clk_1$ to $Cl_K$, and further receives phase selection signals $P_1$ to $P_N$. The digital signals $P_1$ to $P_N$ are for controlling the phase adjustment apparatus 28 to generate a clock signal $Clk_0$ by synthesizing a part of the original clock signals $Cl_1$ to $Cl_K$. The clock signal $Clk_0$ is transmitted to the core circuit 12 to control the timing of the core circuit 12. A core voltage $V_{CORE1}$ and a core voltage $V_{CORE2}$ are respectively supplied to the core circuit 12 and the phase adjustment apparatus 28. The core voltage $V_{CORE1}$ may equal to the core voltage $V_{CORE2}$.

Figure 2A:
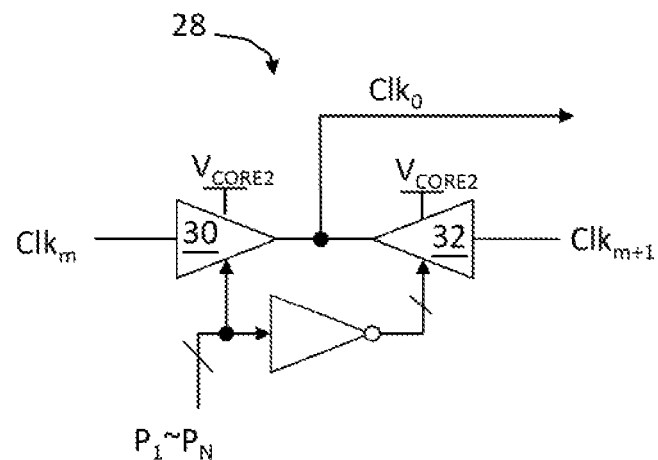
FIG. 2A shows a phase adjustment apparatus in FIG. 1.

FIG. 2A shows another example of the phase adjustment apparatus 28. The phase adjustment apparatus 28 further comprises two driving circuits 30 and 32. Through interpolation, the phase adjustment apparatus 28 generates the clock signal $Clk_0$ by synthesizing two of the original clock signals $Clk_m$ and $Clk_{m+1}$. The phase adjustment apparatus 28 comprises a synthesizing circuit for adjusting weightings of the original clock signals $Clk_m$ and $Clk_{m+1}$ to generate the $Clk_0$ according to the original clock signals $Clk_m$ and $Clk_{m+1}$.

More specifically, the phase selection signals $P_1$ to $P_N$ are for determining driving capabilities of the two driving circuits 30 and 32; the phase adjustment apparatus 28 adjusts weightings of the original clock signals $Clk_m$ and $Clk_{m+1}$ according to a ratio of the driving capability of the driving circuit 30 and that of the driving circuit 32 to generates the clock signal $Clk_O$.

For example, supposing the ratio of the driving capability of the driving circuit 30 to that of the driving circuit 32 is determined as 5:5 by the current phase selection signals $P_1$ to $P_N$, the respective weightings of the original clock signals $Clk_m$ and $Clk_{m+1}$ are then 5:5. Thus, a phase of the clock signal $Clk_O$ is approximately right in the middle between phases of the original clock signals $Clk_m$ and $Clk_{m+1}$.

Figure 2B:
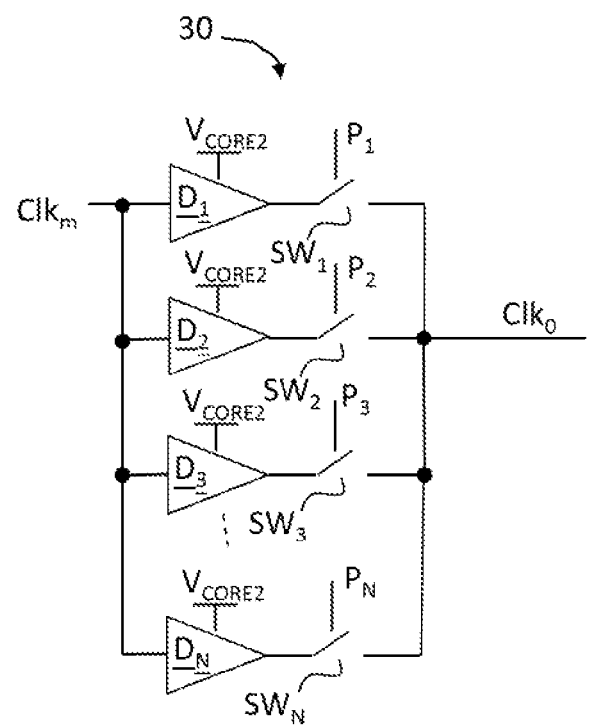
FIG. 2B shows a driving circuit in FIG. 2A.

FIG. 2B shows the driving circuit 30 in FIG. 2A. The driving circuit 30 comprises identical driving cells $D_1$ to $D_N$, each of which has a unit of driving capability. Switches $SW_1$ to $SW_N$ are respectively controlled by the phase selection signals $P_1$ to $P_N$, with each switch determining whether a corresponding driving cell drives the clock signal $Clk_O$. For example, when the switches $SW_1$ to $SW_3$ are shorted by the phase selection signals $P_1$ to $P_N$ while other switches in FIG. 2B are open, the current driving capability of the driving circuit 30 is 3 units. The driving circuit 32 may have circuits similar to those in the driving circuit 30, and shall not be further described.

FIGS. 3A and 3B respectively show relationships between the clock signal $Clk_O$ and signals $S_m$ and $S_{m+1}$ under two different frequencies. The signal $S_m$ represents a waveform of the clock signal is $Clk_O$ when the ratio of the driving capability of the driving circuit 30 to that of the driving circuit 32 is 10:0, and it approximately corresponds to the original clock signal $Clk_m$. The signal $S_{m+1}$ represents a waveform of the clock signal is $Clk_O$ when the ratio of the driving capability of the driving circuit 30 to that of the driving circuit 32 is 0:10, and it approximately corresponds to the original clock signal $Clk_{m+1}$. The amplitudes of the signals $S_m$ and $S_{m+1}$ are determined by a power supply, which are approximately the core voltage $V_{CORE2}$.

As observed from FIG. 3A, the clock signal $Clk_O$ is roughly synthesized from 50% of $S_m$ and 50% of $S_{m+1}$. Although the clock signal $Clk_O$ is not exactly rail-to-rail, the phase of the clock signal $Clk_O$ is almost right in the middle between the two phases of the signals $S_m$ and $S_{m+1}$, which means it is almost right in the middle between the two original signals $Clk_m$ and $Clk_{m+1}$.

In FIG. 3B, the clock signal $Clk_O$ is also approximately synthesized from 50% of $S_m$ and 50% of $S_{m+1}$; however, frequencies of the signals $S_m$ and $S_{m+1}$ are relatively lower. As observed from FIG. 3B, due to flat peaks and flat valleys occurring in the signals $S_m$ and $S_{m+1}$, a level of the clock signal $Clk_O$ maintains at a fixed value at a middle range for a period of time, such that the phase of the clock signal $Clk_O$ is likely unidentifiable or unlikely to be utilized. Therefore, the phase adjustment apparatus 28 needs to adjust for different clock frequencies in order to prevent the complications occurring in FIG. 3B.

FIG. 4 shows another operating system comprising a clock generator 10a and a core circuit 12 according to an embodiment of the present invention. A main difference between the clock generator 10a in FIG. 4 and the clock generator 10 in FIG. 1 is that, a phase adjustment apparatus 28a is powered by an adjusting control voltage $V_{RNG}$. The adjusting control voltage $V_{RNG}$ is lower than a core voltage $V_{CORE}$ by a ratio, which is a value sufficient to allow a slope of signals $T_m$ and a slope of $T_{m+1}$ to render predetermined characteristics, which will be detailed later. The core circuit 12 comprises an amplifier 66 for amplifying a clock signal $Clk_O$ to generate a rail-to-rail clock signal $Clk_{adj}$ having an amplitude of the core voltage $V_{CORE}$.

Figure 5:
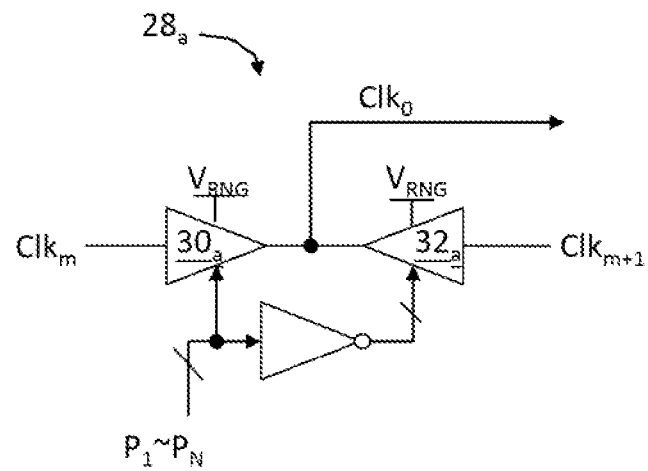
FIG. 5 shows a phase adjustment apparatus in FIG. 4.

FIG. 5 shows the phase adjustment apparatus 28a according to an embodiment of the present invention. Operations of the phase adjustment apparatus 28a are quite similar to those of the phase adjustment apparatus 28. That is, the two original clock signals $Clk_m$ and $Clk_{m+1}$ received at the two clock receiving ends are synthesized into the clock signal $Clk_O$ by interpolation, and a ratio of a driving capability of a driving circuit 30a to that of a driving circuit 32a is determined by using the phase selection signals $P_1$ to $P_N$ received at the digital receiving ends.

For example, supposing the ratio of the driving capability of the driving circuit 30a to that of the driving circuit 32a determined by the phase selections signals $P_1$ to $P_N$ is 5:5, the phase of the clock signal $Clk_O$ is approximately right in the middle between the phases of the original clock signals $Clk_m$ and $Clk_{m+1}$. In addition, supposing the ratio determined by the phase selections signals $P_1$ to $P_N$ is 7:3, the phase of the clock signal $Clk_O$ is closer to the original clock signal $Clk_m$.

Figure 6A:
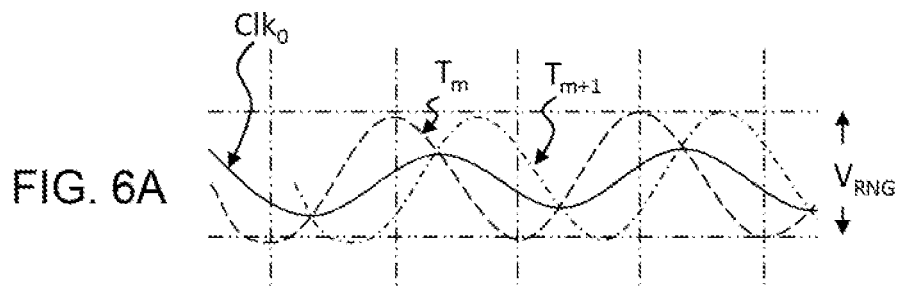
FIGS. 6A and 6B respectively show relationships between the clock signal $Clk_0$ and signals $T_m$ and $T_{m+1}$ under two different frequencies.
Figure 6B:
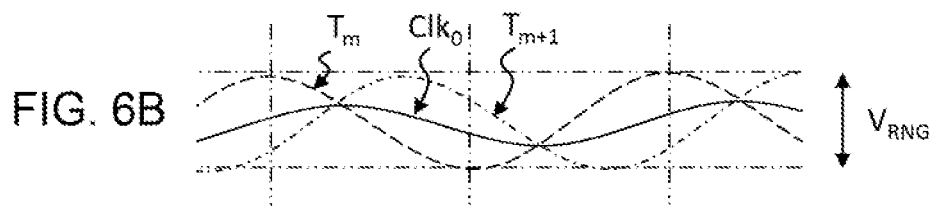

FIGS. 6A and 6B respectively show relationships between the clock signal $Clk_O$ and signals $T_m$ and $T_{m+1}$ under two different clock frequencies. Similar to the signals $S_m$ and $S_{m+1}$ in FIGS. 3A and 3B, the signal $T_m$ represents a waveform of the clock signal is $Clk_O$ when the ratio of the driving capability of the driving circuit 30a to that of the driving circuit 32a is 10:0, and it approximately corresponds to the original clock signal $Clk_m$. The signal $T_{m+1}$ represents a waveform of the clock signal is $Clk_O$ when the ratio of the driving capability of the driving circuit 30a to that of the driving circuit 32a is 0:10, and it approximately corresponds to the original clock signal $Clk_{m+1}$. It should be noted that, since the phase adjustment apparatus 28a is powered by the adjusting control voltage $V_{RNG}$, the amplitudes of the signals $T_m$ and $T_{m+1}$ approximately equal to the adjusting control voltage $V_{RNG}$, and the amplitude of the clock signal $Clk_O$ is, as a result, no greater than the adjusting control voltage $V_{RNG}$.

As observed from FIG. 6A, the clock signal $Clk_O$ is roughly synthesized from 50% of $T_m$ and 50% of $T_{m+1}$. In other words, the phase of the clock signal $Clk_O$ is almost right in the middle between the two original signals $Clk_m$ and $Clk_{m+1}$. Except for the sizes of the amplitudes, the clock signal $Clk_O$ in FIG. 6A and the clock signal $Clk_O$ in FIG. 3A are not much different as far as the waveform is concerned. On the other hand, the differences between waveforms of the signal $Clk_O$ in FIG. 6B and FIG. 3B are significant.

In FIG. 6B, the clock signal $Clk_O$ is also roughly synthesized from 50% of $T_m$ and 50% of $T_{m+1}$; however, in FIG. 6B, the frequencies of the signals $T_m$ and $T_{m+1}$ are relatively lower. A main difference between FIGS. 6B and 3B is that, the clock signal $Clk_O$ in FIG. 6B does not hover at the middle range, and thus its phase is more identifiable or more likely to be utilized. One of the reasons shall be described below.

As previously stated, the phase adjustment apparatus 28a is powered by the adjusting control voltage $V_{RNG}$. Compared to the core voltage $V_{CORE}$ independent form the original clock signals $Clk_m$ and $Clk_{m+1}$, the adjusting control voltage $V_{RNG}$ decreases along with decreases in the frequencies of the original clock signals $Clk_m$ and $Clk_{m+1}$. Accordingly, the reduced adjusting control voltage $V_{RNG}$ renders smaller driving capabilities of the driving circuits 30a and 32a to correspondingly decrease the slopes of the signals $T_m$ and $T_{m+1}$, so that the flat peaks and flat valleys in the signals $S_m$ and $S_{m+1}$ are less likely to occur. Therefore, the clock signal $Clk_O$ synthesized from the signals $T_m$ and $T_{m+1}$ do not hover at the middle range.

In FIG. 4, the phase adjustment apparatus 289a is directly powered by the adjusting control voltage $V_{RNG}$, and with the adjusting control voltage $V_{RNG}$ decreasing as the original clock signals $Clk_m$ and $Clk_{m+1}$ decrease, the situation that the level of the waveform of the clock signal $Clk_O$ hovering at a fixed value at the middle range can be prevented. It is to be noted that directly powering by the adjusting control voltage $V_{RNG}$ is merely an exemplary embodiment rather than an essential characteristic of the present invention.

Figure 7:
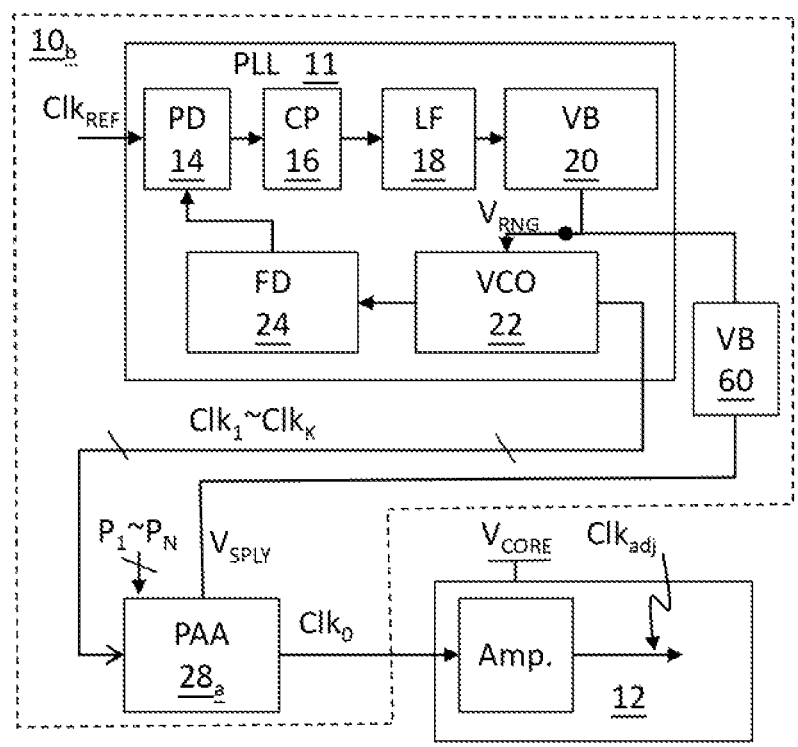
FIGS. 7 and 8 show another two operating systems.
Figure 8:
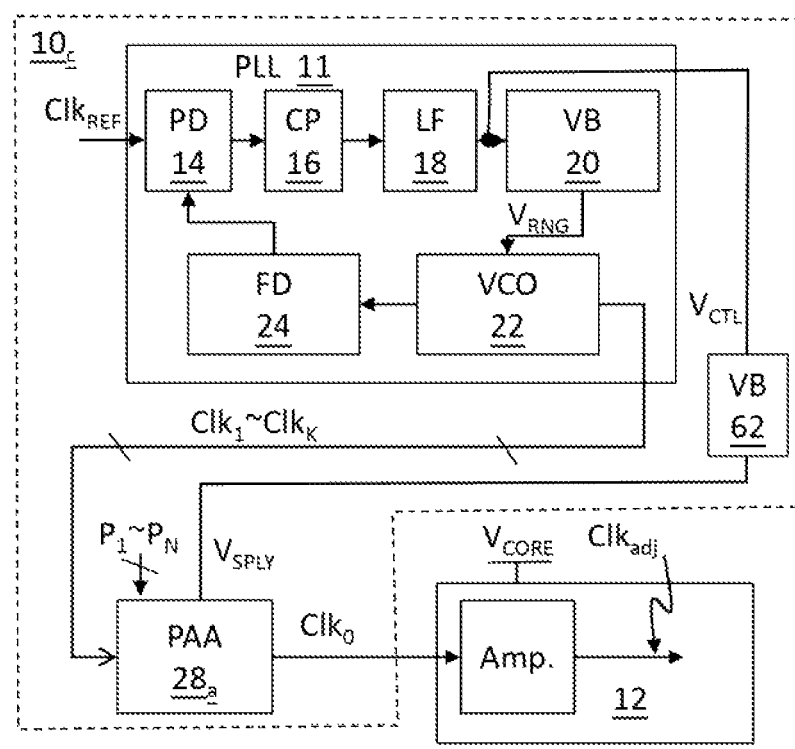

The details below are given with reference to FIGS. 7 and 8. FIG. 7 shows another operating system. A voltage buffer 60 generates a supply voltage $V_{SPLY}$ according to the adjusting control voltage $V_{RNG}$ to power the phase adjustment apparatus 28a. FIG. 8 shows yet another operating system. A voltage buffer 62 generates a $V_{SPLY}$ according to the control voltage $V_{CTL}$ to power the phase adjustment apparatus 28a. Preferably, the supply voltage $V_{SPLY}$ is not greater than the core voltage $V_{CORE}$ of the core circuit 12.

In conclusion, the control voltage $V_{CTL}$, the adjusting control voltage $V_{RNG}$ and the supply voltage $V_{SPLY}$ are positively correlated. The adjusting control voltage and the supply voltage $V_{SPLY}$ increase as the control voltage $V_{CTL}$ gets greater. An essence of the present invention is that, through a voltage interlinked with the frequencies of the original clock signals $Clk_m$ and $Clk_{m+1}$ or through a voltage lower than the core voltage $V_{CORE}$ that powers the phase adjustment apparatus 28a, a situation that the level of the waveform of the clock signal $Clk_O$ hovering at a fixed value in the middle range is prevented. In an embodiment, the control voltage $V_{CTL}$: the adjusting control voltage $V_{RNG}$: the supply voltage $V_{SPLY}$ equals 1:1:1. In another embodiment, values of the control voltage $V_{CTL}$, the adjusting control voltage $V_{RNG}$ and the supply voltage $V_{SPLY}$ do not equal to one another.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A phase adjustment apparatus, for providing a clock signal to a core circuit powered by a core voltage, the phase adjustment apparatus comprising:
    two clock receiving ends, for respectively receiving two original clock signals having a same frequency while the two original clock signal possess two different phases;
    a plurality of digital receiving ends, for receiving a plurality of phase selection signals;
    a synthesizing circuit, for generating the clock signal according to the phase selection signals and the two original clock signals;
    wherein, the synthesizing circuit is powered by a first voltage lower than the core voltage.

2. The phase adjustment apparatus according to claim 1, wherein frequencies of the two original clock signals are controlled by an adjusting control voltage, and the first voltage is associated with the adjusting control voltage.

3. The phase adjustment apparatus according to claim 2, wherein the first voltage equals the adjusting control voltage.

4. The phase adjustment apparatus according to claim 2, further comprising:
    a voltage buffer, for providing the first voltage according to the adjusting control voltage.

5. The phase adjustment apparatus according to claim 1, coupled to a phase-locked loop, the phase-locked loop for providing the first voltage and the two original clock signals, the phase-locked loop comprising:
    a loop filter, for providing a control voltage, wherein the first voltage is generated according to the control voltage;
    a voltage buffer, for receiving the control voltage and generating an adjusting control voltage; and
    a voltage-controller oscillator (VCO), for receiving the adjusting control voltage and generating the two original clock signals, wherein the adjusting control voltage controls the frequencies of the two original clock signals.

6. The phase adjustment apparatus according to claim 1, wherein the synthesizing circuit determines a ratio according to the phase selection signals, and the phase adjustment apparatus generates the clock signal according to the ratio.

7. A method for phase adjustment, for providing a clock signal to a core circuit, the core circuit being powered by a core voltage, the method comprising:
    generating two original clock signals according to a control voltage using voltage-controlled oscillation;
    providing the clock signal by synthesizing the two original clock signals according to a ratio, the two original clock signals having a same frequency while the two original clock signals possess different phases;
    providing a synthesizing circuit, for generating the clock signal according to the two original signals; and
    powering the synthesizing circuit by a first voltage;
    wherein, an amplitude of the clock signal is smaller than the core voltage, and the first voltage is smaller than the core voltage.

8. The method according to claim 7, a control voltage controlling the frequencies of the two original clock signals, the method further comprising:
    generating the first voltage according to the control voltage; and
    determining the ratio according to a plurality of phase selection signals.

9. The method according to claim 7, further comprising:
    amplifying the clock signal to generate an amplified clock signal, an amplitude of the amplified clock signal equals to the core voltage.

* * * * *